United States Patent
Gupta et al.

(10) Patent No.: US 7,629,061 B2
(45) Date of Patent: Dec. 8, 2009

(54) HETEROSTRUCTURE DEVICES USING CROSS-LINKABLE POLYMERS

(75) Inventors: Rahul Gupta, Milpitas, CA (US); Andrew Ingle, Fremont, CA (US)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 10/812,568

(22) Filed: Mar. 30, 2004

(65) Prior Publication Data

US 2005/0158523 A1    Jul. 21, 2005

Related U.S. Application Data

(60) Provisional application No. 60/537,415, filed on Jan. 16, 2004.

(51) Int. Cl.
*H01L 51/54* (2006.01)

(52) U.S. Cl. .................. 428/690; 428/917; 313/504; 313/506

(58) Field of Classification Search .......... 428/690, 428/917, 212; 313/504, 506
See application file for complete search history.

(56) References Cited

U.S. PATENT DOCUMENTS

| | | | | |
|---|---|---|---|---|
| 5,766,779 A | * | 6/1998 | Shi et al. | 428/690 |
| 6,107,452 A | * | 8/2000 | Miller et al. | 528/422 |
| 6,111,356 A | * | 8/2000 | Roitman et al. | 313/506 |
| 6,111,357 A | * | 8/2000 | Fleming et al. | 313/509 |
| 6,395,209 B2 | * | 5/2002 | Yoshida et al. | 264/137 |
| 6,656,611 B2 | * | 12/2003 | Tai et al. | 428/690 |
| 6,787,063 B2 | * | 9/2004 | Endo et al. | 252/301.16 |
| 6,982,179 B2 | * | 1/2006 | Kwong et al. | 438/22 |
| 2002/0011779 A1 | * | 1/2002 | Towns et al. | 313/498 |
| 2002/0044188 A1 | | 4/2002 | Codos | |
| 2002/0060518 A1 | | 5/2002 | Duineveld et al. | |
| 2002/0106529 A1 | * | 8/2002 | Okunaka et al. | 428/690 |
| 2002/0197511 A1 | * | 12/2002 | D'Andrade et al. | 428/690 |
| 2003/0134147 A1 | * | 7/2003 | Burn et al. | 428/690 |
| 2003/0170492 A1 | * | 9/2003 | Anderson et al. | 428/690 |
| 2004/0021413 A1 | * | 2/2004 | Ito et al. | 313/504 |
| 2004/0101618 A1 | * | 5/2004 | Ottermann et al. | 427/66 |
| 2004/0214038 A1 | * | 10/2004 | Kwong et al. | 428/690 |
| 2004/0266207 A1 | * | 12/2004 | Sirringhauss et al. | 438/725 |

OTHER PUBLICATIONS

Muller et al., Synthetic Metals, 111-112 (2000), p. 31-34.*
Bacher et al., Macromolecules, (1999), vol. 32, p. 4551-4557.*
Li et al., Synthetic Metals, vol. 84, (1997), p. 437-438.*
Mueller, et al., *Multi-color Organic Light-emitting Displays by Solution Processing*, Nature, vol. 421, pp. 829-833, Feb. 20, 2003.

* cited by examiner

*Primary Examiner*—Dawn Garrett
(74) *Attorney, Agent, or Firm*—Fish & Richardson P.C.

(57) ABSTRACT

What is disclosed is an organic electronic device which has at least one hetero-structure of film layers. The layers can be cross-linked and stacked one upon another to add a plurality of different functions and optimizations to the device, particularly in organic light emitting diodes.

43 Claims, 3 Drawing Sheets

HETEROSTRUCTURE DEVICES USING CROSS-LINKABLE POLYMERS

CROSS-REFERENCE TO RELATED APPLICATIONS

This application claims priority from a provisional patent application entitled "Heterostructure Devices Using Cross-Linkable Polymers" filed on Jan. 16, 2004 bearing Ser. No. 60/537,415.

BACKGROUND

1. Field of the Invention

This invention relates generally to the art of thin film device processing and fabrication. More specifically, the invention relates to the fabrication of Organic Light Emitting Diode based displays and other devices.

2. Related Art

Display and lighting systems based on LEDs (Light Emitting Diodes) have a variety of applications. Such display and lighting systems are designed by arranging a plurality of photo-electronic elements ("elements") such as arrays of individual LEDs. LEDs that are based upon semiconductor technology have traditionally used inorganic materials, but recently, the organic LED ("OLED") has come into vogue for certain applications. Examples of other elements/devices using organic materials include organic solar cells, organic transistors, organic detectors, and organic lasers. There are also a number of bio-technology applications such as bio-chips for DNA recognition, combinatorial synthesis, etc. which utilize organic materials.

An OLED is typically comprised of two or more thin at least partially conducting organic layers (e.g., an electrically conducting hole transporting polymer layer (HTLs) and an emissive polymer layer where the emissive polymer layer emits light) which are sandwiched between an anode and a cathode. Under an applied forward potential, the anode injects holes into the conducting polymer layer, while the cathode injects electrons into the emissive polymer layer. The injected holes and electrons each migrate toward the oppositely charged electrode and recombine to form an exciton in the emissive polymer layer. The exciton relaxes to a lower energy state by emission of radiation and in process, emits light.

Other organic devices, such as organic transistors, organic sensors, and color filters will also typically contain a conducting organic (polymer) layer and other organic layers. A number of these OLEDs or other organic devices can be arranged in a pattern over a substrate as for instance in display system. One way of patterning organic electronic devices over a substrate is to create pockets by photo-lithography and then utilize a process known as ink-jet printing. The use of a photo-resist layer to define pockets for inkjet printing is disclosed in published patent application Number US2002/0060518 A1 entitled "Organic Electroluminescent Device and Method of Manufacturing Thereof". In ink-jet printing, polymer or organic solution is deposited by discharging droplets of the solution into the pockets from a print head. One common application of inkjet printing is the patterning of multi-color OLED pixels (such as RGB patterned pixels) in order to manufacture a color display.

But inkjet printing and other selective deposition techniques which fabricate polymer films for devices have some limitations. One limitation is in being able to achieve multi-layer or "hetero-structure" devices that have adjacent films that are soluble in the same type of solvents. This is because each polymer solution which is deposited remains soluble even after drying. When an additional organic layer is required to be fabricated over an existing layer, the existing layer can only be made of a material which will not be soluble under the same solvent being used to deposit the additional layer. Otherwise, existing layers will be degraded substantially or even dissolved.

Recent developments have shown that UV curable inks can be used to deposit dye pigments for printing posters and textiles (U.S. patent application No. 20020044188). UV curable inks are solutions which cure or dry into film under application of ultraviolet or other radiation. For spin-coating (rather than selective deposition such as inkjet printing) techniques, a recent publication has outlined the use of "cross-linked" polymers to make RGB displays. See "Multi-colour organic light-emitting displays by solution processing"; C. David Muller, Aurelie Falcou, Nina Reckefuss, Markus Rojahn, Valerie Wiederhirn, Paula Rudati, Holger Frohne, Oskar Nuyken, Heinrich Becker, Klaus Meerholz; Nature Volume 421, Pages 829-833 (20 Feb. 2003). A cross-linked (or "cross-linkable") polymer is a polymer which has been modified by the addition of a chemical group which chemically reacts with the original polymer to create side-chains which can alter the polymer's properties. In this publication, the authors propose spin coating UV curable inks that are then cross-linked such that the resulting film becomes insoluble. The films are then patterned to create the colored displays. This suffers from the drawback that additional processing is required on the deposited films in order to pattern them.

Thus there is a need for patterned devices that have hetero-structures wherein additional layers may be added to existing layers without degrading the integrity of existing layers.

DETAILED DESCRIPTION OF THE INVENTION

In accordance with the invention, a hetero-structure organic electronic device is disclosed. The device is created by depositing organic material via inkjet or other techniques, and then cross-linking the deposited organic material to render it insoluble. This process can be repeated to create heterostructure devices containing as many layers of film as desired. Cross-linking is desirable if a previously deposited layer/film is soluble in the organic solution that is to follow. In such a case, cross-linking of the previously formed organic layer will cause it to become insoluble and thus, will prevent that layer from being degraded by another organic solution that is deposited over it. Cross-linking can be used to create multi-layer films, each of which may be cross-linked.

For example, in an OLED, a Hole Transport Layer (HTL), emissive layer and electron transport layer (ETL) can be sequentially deposited on top of a transparent anode. Advantageously, cross-linked films allow flexibility in choosing the band gaps and refractive indices of the various materials to control the position of the recombination zone and also the optical confinement of the photons emitted. This can lead to an improvement in both the internal and external quantum efficiency of the device. An example of two different hetero-structures used for such a device is shown in FIG. 1(*a*)-(*b*).

Figure 1B:
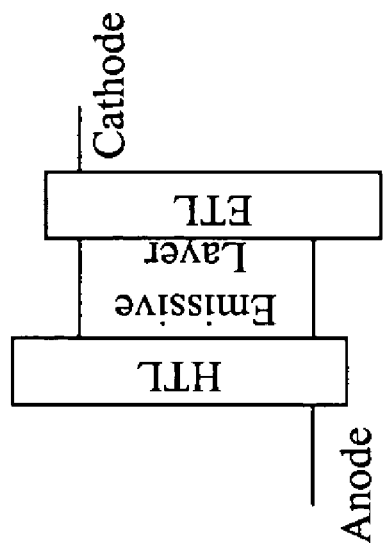
FIG. 1(a)-(b) shows an example of two different heterostructure devices.
Figure 1A:
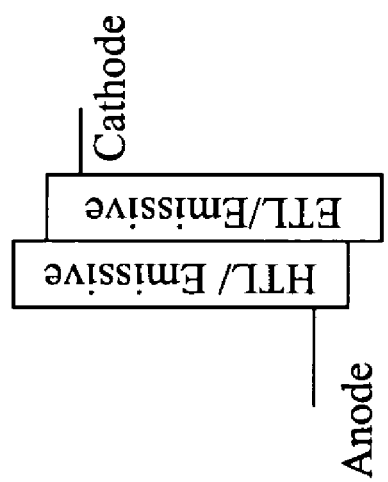

In a single hetero-structure device (FIG. 1(*a*)) the holes and electrons are confined at the interface between the HTL and ETL and hence there is a large increase in the radiative recombination efficiency due to the close proximity of the large number of holes and electrons at the interface. In a double hetero-structure device (FIG. 1(*b*)), the hole transport, electron transport and emission can be optimized in each of the individual layers. Because of the band lineups, the holes that are injected into the emissive layer from the hole transport layer (HTL) and the electrons that are injected from the electron transport layer would be confined in the emissive layer and the probability of these carriers escaping from this layer without recombination is significantly reduced. This would significantly increase the recombination efficiency of the holes and electrons and would result in increased internal quantum efficiency for radiative recombination.

The term "hetero-structure" is usually used to define a structure that is made of layers of two or more different materials. The materials may have different compositions and different properties, for example hetero-structures used in semiconductor devices may have different band gaps and/or different positions of their energy bands with respect to the vacuum levels. Hetero-structures are well known to those skilled in the art of making semiconductor devices such as lasers.

The same technique can be used to make efficient photo-detectors, as we can optimize the transport and absorption in each individual layers and increase the efficiency of conversion of light into electrical energy. Each of the layers in the above structures could be a single polymer, a copolymer or a blend and could have many components that can be used to optimize the performance of each of these layers.

In one embodiment of the invention, the organic solution used in fabricating the organic electronic device includes UV (ultra-violet) curable inks. UV curable inks are capable of being cross-linked by exposure to ultraviolet radiation. In other embodiments of the invention, the organic solutions used and thermally curable and thus, can be cross-linked by exposure to heat.

In accordance with the invention, the optical spectrum and dosage of ultra-violet radiation or heat, i.e. the "curing level," which is defined in part by the intensity and exposure time, can be varied as needed to control the thickness of the resulting film. In general, the higher the curing level, the greater the thickness of the cross-linked organic film. In some embodiments of the invention, the exposure of the solution for the purpose of cross-linking is performed from the bottom of the device, which can lead to a flatter resulting film and allow the excess solution to be removed from the top by washing or other means. Bottom exposure also enables very good thickness control as the absorption depth of the liquid deposited determines the thickness of the film that is cross-linked.

The combination of inkjet printing with crosslinking of films yields some advantages in flexibility of design. For example, for a multi-color display application, it may be possible to achieve different thickness for the different layers used for each color. This would allow the use of different materials for each color. For instance, it may be possible to match the hole transport layer and/or electron transport layer for each color polymer. Inkjet printing would provide an easy solution to achieve this. The same technique can be used to deposit color filters, phosphors or any other materials for varied applications.

In describing the invention, the terms "solution" "layer" and "film" refer to the same entity which may be under different physical states. When an organic "solution" is deposited on a surface, it often dries over time into a "film" often aided by heat or other mechanism. The film then becomes a layer of the device capable of carrying out specific functions. Also, the words "polymer solution" and "organic solution" are used interchangeably to refer to any organic compound, monomer, polymer, and the like and is not intended to be restrictive to any one organic compound or class of compounds.

Figure 2:
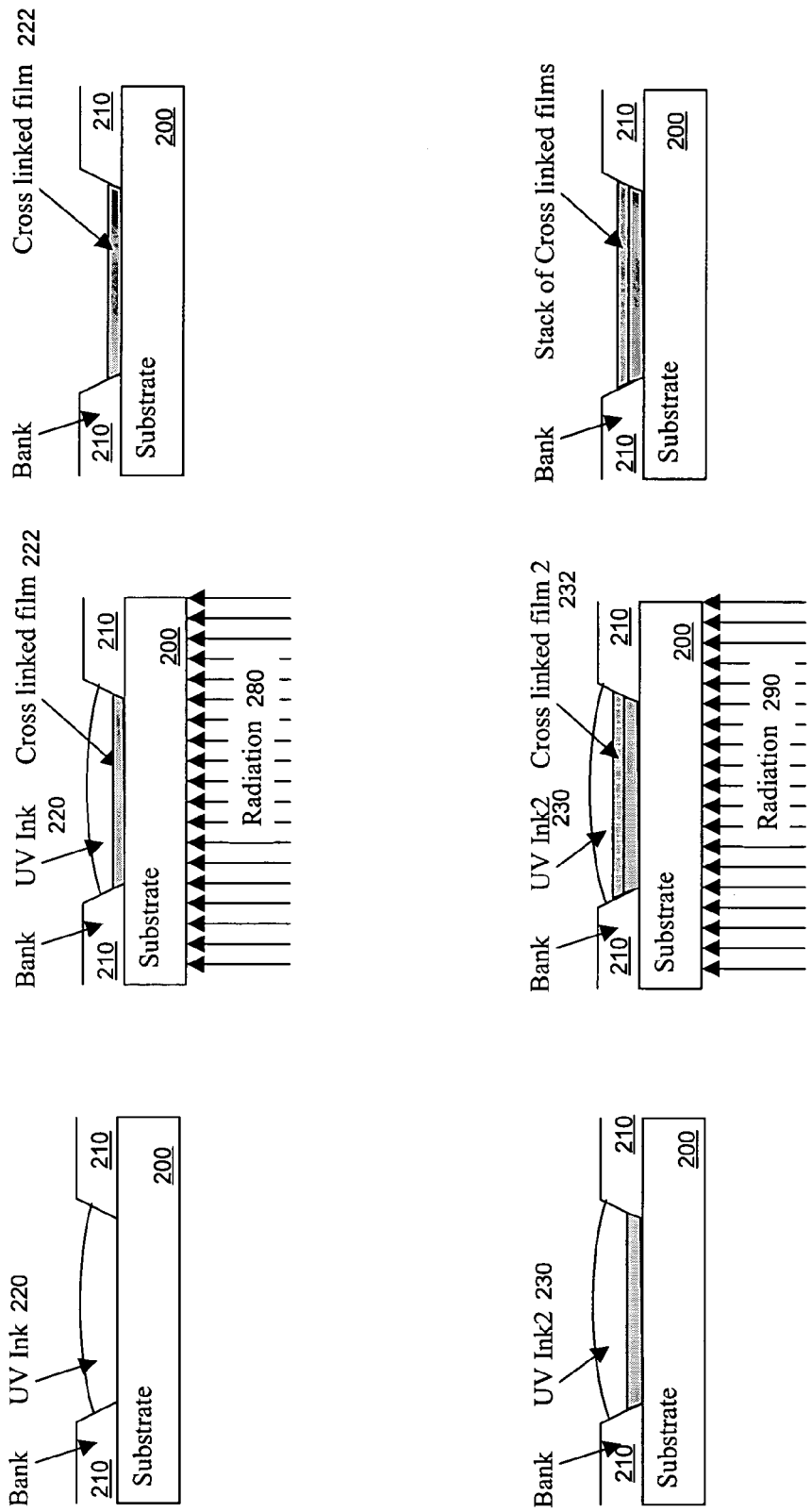
FIG. 2 illustrates stages of inkjet processing of an organic multi-layer device in accordance with at least one embodiment of the invention.

FIG. 2 illustrates stages of inkjet processing of an organic multi-layer device in accordance with at least one embodiment of the invention. The organic electronic device illustrated in FIG. 2 includes a substrate 200 which may have other materials (like an anode in the case of an OLED) patterned on its surface (not shown). Substrate 200 may be any appropriate deposition surface which will vary in composition, structure and material depending upon the type of device to be fabricated. In order to form pockets or discrete deposition regions on the surface of the substrate 200, photo-resist banks 210 are formed and patterned over the substrate 200. This allows a substance such as a UV-curable ink 220 to be deposited into the pocket defined by the banks 210 and onto the surface of the substrate 200 (stage A). The UV ink 220 is inkjet or otherwise deposited onto substrate 200 to form a convex/dome shape or other shapes made possible by different formulations of ink and by surface treatments. Photo-resist banks may be made of any materials, or even defined by etching the substrate or lower electrode layer to form wells. In addition, it may be possible to inkjet print without the use of any photo-resist banks.

At stage B, radiation 280 is applied from the bottom side of the device through the substrate 200 to the UV ink 220. This radiation 280 cures at least a portion of the UV ink 220 (from bottom to top) into a cross-linked film 222. The level of curing which is a function of the optical spectrum of the radiation 280, the intensity of the radiation 280 and time of exposure to radiation 280 will determine and can be used to control the height of the film 222. The cross-linked film 222 is insoluble unlike non-cross-linked film resulting from drying of the same solution 220. If there is excess solution 222 on top of the cross-linked film 222, this can be washed away as shown in stage C.

In stage D, the next organic solution, UV ink2 230 is deposited (e.g. by inkjet) over cross-linked film 222. Then, as shown, a second dose of radiation 290 is applied from the bottom side of the substrate 200 in order to form a cross-linked film 232 from UV ink2 230 (stage E). Radiation 290 may be of the same or different level and/or wavelength as radiation 280, depending upon the content of UV ink2 230. For instance, UV ink2 230 may require a stronger dosage of radiation in order to cure it when compared to UV ink 220. Also, it may be desirable to make the height of the cross-linked 232 different from the height of cross-linked film 222. The level of curing can thus be different for producing film 232 and for producing film 222. Finally, if there is any excess solution 230 that is not cross-linked, it can be removed to leave a flat cross-linked film 232. The cross-linking and stacking of films can be repeated as desired to create hetero-structure devices. At stages B and E radiation may be applied from the top of the device (from above the device) rather than from the bottom, if desirable.

Figure 3:
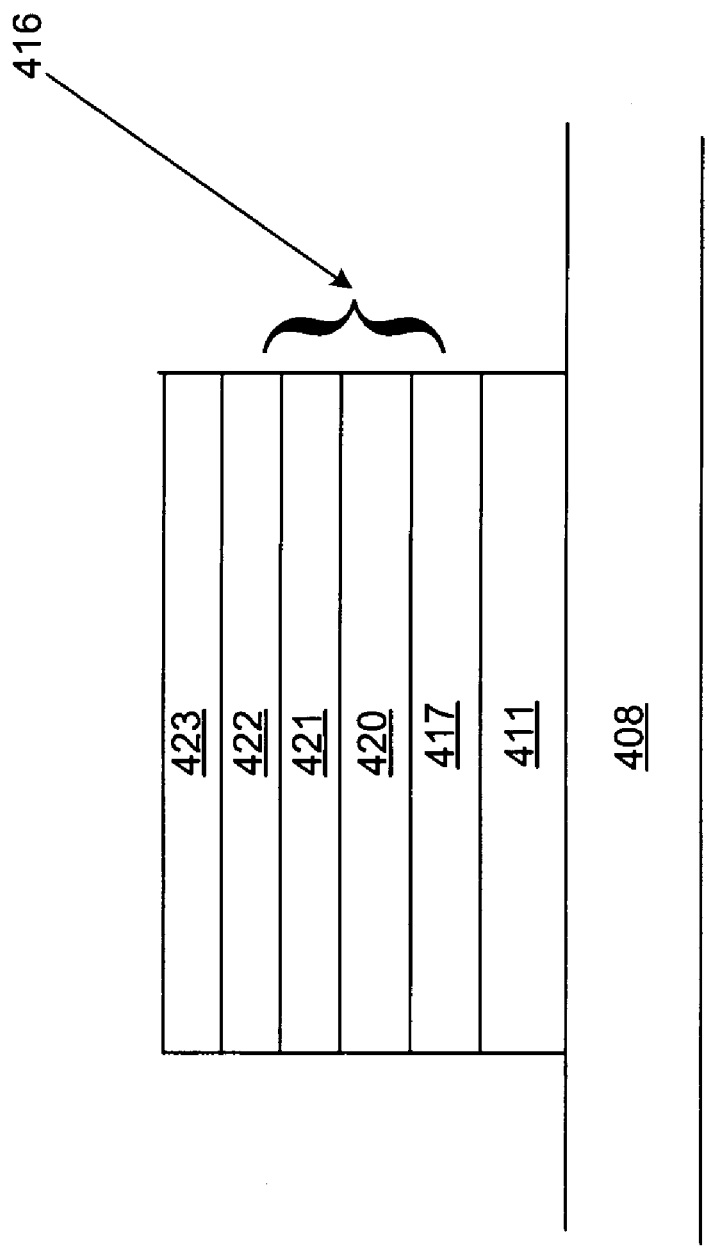
FIG. 3 shows a cross-sectional view of an embodiment of an organic electronic device 405 according to the invention.

FIG. 3 shows a cross-sectional view of an embodiment of an organic electronic device according to the invention. As shown in FIG. 3, the organic electronic device includes a first electrode 411 on a substrate 408. As used within the specification and the claims, the term "on" includes when layers are in physical contact and when layers are separated by one or more intervening layers. The first electrode 411 may be patterned for pixilated applications or unpatterned for backlight applications. If the electronic device is a transistor, then the first electrode may be, for example, the source and drain contacts of that transistor. A photo-resist material may be deposited on the first electrode 411 and patterned to form a bank structure (not pictured) having an aperture that exposes the first electrode 411. The aperture may be a pocket (e.g., a pixel of an OLED display) or a line.

One or more organic materials is deposited (preferably ink-jet) onto first electrode 411 (and into the aperture, if available) to form one or more organic layers of an organic stack 416. One or more of the layers (films) comprising organic stack 416 are, in accordance with the invention, cross-linked to become insoluble. The organic stack 416 is disposed above the first electrode 411. The organic stack 416 includes a hole transporting (conducting polymer) layer ("HTL") 417 and other active organic layer 420. If the first electrode 411 is an anode, then the HTL 417 is on the first electrode 411. Alternatively, if the first electrode 411 is a cathode, then the active electronic layer 420 is on the first electrode 411, and the HTL 417 is on the active electronic layer 420. The electronic device also includes a second electrode 423 on the organic stack 416. If the electronic device is a transistor, then the second electrode 423 may be, for example, the gate contact of that transistor.

Adding additional layers may be desirable in order to improve performance of devices and may include functionalities such as hole transport, electron transport, hole blocking, optical confinement etc. In accordance with the invention, cross-linked films enable a plurality of such organic layers to be formed one of top of another. For example, illustrated are two such additional layers 421 and 422, described below. Additional layers such as 421 and 422 may be integrated as functionalities of the same physical layer (e.g. by cross-linking) or integrated into a typically found or pre-existing layer. For instance, layers such as HTL 417 may have additional functionality not typically associated with HTLs such as wave-guiding properties. Such functionality can be achieved by cross-linking groups which add these functions into organic material which primarily achieves a different function. In addition, the primary function for a particular layer, such as hole transport for a hole transport layer, can be enhanced by the addition of other organic materials with the combination being cross-linked, if desirable. In addition a layer made of a single material may be able to provide more than one functionality, for example the same layer may provide hole transport, electron blocking and optical waveguiding. These layers, in accordance with the invention, are described in greater detail below.

Substrate 408:

The substrate 408 can be any material that can support the organic and metallic layers on it. The substrate 408 can be transparent or opaque (e.g., the opaque substrate is used in top-emitting devices). By modifying or filtering the wavelength of light which can pass through the substrate 408, the color of light emitted by the device can be changed. The substrate 408 can be comprised of glass, quartz, silicon, plastic, or stainless steel; preferably, the substrate 408 is comprised of thin, flexible glass. The preferred thickness of the substrate 408 depends on the material used and on the application of the device. The substrate 408 can be in the form of a sheet or continuous film. The continuous film can be used, for example, for roll-to-roll manufacturing processes which are particularly suited for plastic, metal, and metallized plastic foils. The substrate can also have transistors or other switching elements built in to control the operation of the device.

In accordance with the invention, radiation used to cross-link organic films can be applied from the bottom of the device and through substrate 408 in the case of non-opaque material used for substrate 408. Alternatively, the cross-linking radiation can be applied from the top of the device, particularly with respect to opaque substrates. Thus, it is preferable that the substrate 408 be of a material and with a thickness that enables ultraviolet or other radiation to pass through as needed to achieve cross-linking.

First Electrode 411:

In one configuration, the first electrode 411 functions as an anode (the anode is a conductive layer which serves as a hole-injecting layer and which comprises a material with work function greater than about 4.5 eV). Typical anode materials include metals (such as platinum, gold, palladium, indium, and the like); metal oxides (such as lead oxide, tin oxide, ITO, and the like); graphite; doped inorganic semiconductors (such as silicon, germanium, gallium arsenide, and the like); and doped conducting polymers (such as polyaniline, polypyrrole, polythiophene, and the like).

For OLEDs, the first electrode layer 411 is usually thin enough so as to be semi-transparent and allow at least a fraction of light to transmit through (in bottom emitting OLEDs). The thickness of the first electrode 411 is from about 10 nm to about 1000 nm, preferably, from about 50 nm to about 200 nm, and more preferably, is about 100 nm. As such, any thin-film deposition method may be used in the fabricating step 510. These include, but are not limited to, vacuum evaporation, sputtering, electron beam deposition, chemical vapor deposition, etching and other techniques known in the art and combinations thereof. The process also usually involves a baking or annealing step in a controlled atmosphere to optimize the conductivity and optical transmission of anode layer. Photolithography can then be used to define any pattern in the lower electrode layer.

In accordance with the invention, the top exposed surface of first electrode 411 might become the deposition surface upon which the organic solution is deposited and cross-linked. In an alternative configuration, the first electrode layer 411 functions as a cathode (the cathode is a conductive layer which serves as an electron-injecting layer and which comprises a material with a low work function). The cathode, rather than the anode, is deposited on the substrate 408 in the case of, for example, a top-emitting OLED. Typical cathode materials are listed below in the section for the "second electrode 423".

HTL 417:

The HTL 417 has a much higher hole mobility than electron mobility and is used to effectively transport holes from the first electrode 411 to the substantially uniform organic polymer layer 420. The HTL 417 functions as: (1) a buffer to provide a good bond to the substrate; and/or (2) a hole injection layer to promote hole injection; and /or (3) a hole transport layer to promote hole transport. In accordance with the invention, HTL 417 may also act as an electron blocking layer. In addition, in accordance with the invention, HTL 417 may also function as a low index of refraction layer for wave-guiding.

The HTL 417 can be formed by deposition of a organic solution, polymers or small molecule materials. For example, the HTL 417 can be made of tertiary amine or carbazole derivatives both in their small molecule or their polymer form, or organic solutions such as conducting polyaniline ("PANI"), or preferably, solutions of "PEDOT:PSS." A PEDOT:PSS solution is comprised of water, polyethylenedioxythiophene ("PEDOT"), and polystyrenesulfonic acid ("PSS") (this solution is referred to, herein, as a PEDOT:PSS solution) and may be combined with or contain other components as well. The HTL 417 has a thickness from about 5 nm to about 1000 nm, preferably from about 20 nm to about 500 nm, and more preferably from about 50 to about 250 nm. In addition, the solution may be blended wit cross-linking side groups or chains which will bind to the base solution (such as the PEDOT:PSS solution) to render it insoluble.

The HTL 417 can be deposited using selective deposition techniques or nonselective deposition techniques. Examples of selective deposition techniques include, for example, ink jet printing, flex printing, and screen printing. Examples of nonselective deposition techniques include, for example, spin coating, dip coating, web coating, and spray coating. The hole transporting material is deposited on the first electrode 411 and then dried into a film. The dried material represents the hole transport layer.

As mentioned above, in accordance with the invention, the HTL 417 may be cross-linked to render it insoluble if the next layer to be deposited on top of the layer HTL 417 will result in the dissolution of the layer HTL 417. Examples of typical base PEDOT:PSS solution are Baytron P CH8000 and Baytron AI4083. Some embodiments of the invention, combine base PEDOT:PSS solution with another side-group such as multivalent cations or divalent metal ions or amines or other acidic groups which bond to the PEDOT:PSS after cross-linking. For instance, in the case of UV cross-linking. In other embodiments, silanes such as silicic acid can be used as cross-linking agents. In still other embodiments of the invention, it may be possible to cross-link the organic solution used in forming the HTL layer with the substrate or first electrode layer. The chemistry of cross-linking is not a subject of the invention, and the above are provided as merely examples of cross-linking. The side-groups, monomers, oligomers, co-polymers, acids, and so on used in cross-linking will vary based upon the properties of the base HTL solution and upon the method of cross-linking (whether thermal, ultra-violet or chemical). In the case of ultraviolet cross-linking, an initiating agent may also be combined with the base organic solution and cross-linking group to speed up and initiate the cross-linking process. A photo-initiator in such cases can be incorporated into the polymer chain as well, if desirable. One example of cross-linking initiator or agent is a magnesium cation (Mg2) for UV cross-linking. In the case of thermal cross-linking, an organic diamine or other amine/amide can be used to cross-link together the functional HTL sulfonic acids (such as PSS). Certain co-polymer and other side-groups cross-link without the need for an additional initiating agent. The invention can serve to provide an insoluble HTL film which can be ink-jet and allow other organic layers to be ink-jet upon it without undue threat of degrading the existing HTL film.

Electron Blocking Layer Function of HTL 417

In accordance with at least one embodiment of the invention, HTL 417 also acts as an electron blocking layer. HTL 417 can be configured to exhibit an electron blocking function by adjusting the energy band levels of the HTL 417 and/or the energy levels of the layer on top (e.g. electronic layer 420) of the HTL 417. If the lowest unoccupied molecular orbital (LUMO) of the HTL 417 is higher than the LUMO of the active electronic layer 420, then electrons that are injected or flow towards the HTL 417 will be "blocked" (not allowed to pass) and will accumulate in the active electronic layer 420. For OLED devices, this will potentially improve the ability of these electrons to recombine and emit light, thereby improving the efficiency of the device.

Low Index of Refraction Wave-Guiding Function of HTL 417

In accordance with the invention, yet another function, such as wave-guiding, can be added to a layer which has a different primary function and a secondary function. For instance, as mentioned above, HTL 417 has a primary function of hole transport and a secondary function of electron blocking. For example, it may be possible to add wave-guiding functionality by modifying the levels of certain compounds such as phenyl or methyl groups which can serve to modify the index of refraction of the layer to which the modification is made. For example if it is desirable to make the light waveguide in the active electronic layer 420, the HTL 417 can be given a low index of refraction relative to the active electronic layer 420 so that light from the active electronic layer 420 is totally internally reflected and is confined in the active electronic layer 420. This would make the light waveguide in the active electronic layer 420. A similar technique can be used to make the light waveguide in any layer as desired and is well known to those in the art. Choosing various layers with the right indices and thickness can also result in higher external quantum efficiencies for the OLED devices. This is a result of reduced reflections of the emitted light at the interfaces of the various layers. Such structures, where the emitted light waveguides, are very important for making lasers as well as high efficiency and high speed detectors.

Active Electronic Layer 420:

Active electronic layer 420 can include one or more layers. Active electronic layer 420 includes an active electronic material. Active electronic materials can include a single active electronic material, a combination of active electronic materials, or multiple layers of single or combined active electronic materials. Preferably, at least one active electronic material is organic.

For organic LEDs (OLEDs), the active electronic layer 316 contains at least one organic material that emits light. These organic light emitting materials generally fall into two categories. The first category of OLEDs, referred to as polymeric light emitting diodes, or PLEDs, utilize polymers as part of active electronic layer 420. The polymers may be organic or organometallic in nature. As used herein, the term organic also includes organometallic materials. Devices utilizing polymeric active electronic materials in active electronic layer 316 are especially preferred. In addition to materials that emit light, active electronic layer 420 may include a light responsive material that changes its electrical properties in response to the absorption of light. Light responsive materials are often used in detectors and solar panels that convert light energy to electrical energy.

If the organic electronic device is an OLED or an organic laser, then the organic polymers are electroluminescent ("EL") polymers that emit light. The light emitting organic polymers can be, for example, EL polymers having a conjugated repeating unit, in particular EL polymers in which neighboring repeating units are bonded in a conjugated manner, such as polythiophenes, polyphenylenes, polythiophenevinylenes, or poly-p-phenylenevinylenes or their families, copolymers, derivatives, or mixtures thereof. Using inkjet printing, there may be a plurality of different emissive polymer substances. For instance, there may be red, green and blue emitting emissive polymers in the print head which are deposited depending upon the desired color to be emitted in a given pixel location which is defined by a pocket. The emitting polymer substances are deposited on the conducting polymer layer by the print head in the exact area defined by the pockets. The emissive polymer layer results from the drying of the substance deposited by the print head. More specifically, the organic polymers can be, for example: polyfluorenes; poly-p-phenylenevinylenes that emit white, red, blue, yellow, or green light and are 2-, or 2,5-substituted poly-p-pheneylenevinylenes; polyspiro polymers; LUMATION polymers that emit green, red, blue, or white light and are produced by Dow Chemical, Midland Michigan; or their families, copolymers, derivatives, or mixtures thereof.

If the organic electronic device is an organic solar cell or an organic light detector, then the organic polymers are light responsive material that changes its electrical properties in response to the absorption of light. The light responsive material converts light energy to electrical energy.

If the organic electronic device is an organic transistor, then the organic polymers can be, for example, polymeric and/or oligomeric semiconductors. The polymeric semiconductor can comprise, for example, polythiophene, poly(3-alkyl) thiophene, polythienylenevinylene, poly(para-phenylenevinylene), or polyfluorenes or their families, copolymers, derivatives, or mixtures thereof.

In addition to polymers, smaller organic molecules that emit by fluorescence or by phosphorescence can serve as a light emitting material residing in active electronic layer 420. Unlike polymeric materials that are applied as solutions or suspensions, small-molecule light emitting materials are preferably deposited through evaporative, sublimation, or organic vapor phase deposition methods. Small molecules, in accordance with the invention, may also be cross-linked similar to polymers. Cross-linked small molecule layers can be stacked one upon another, if desired. Combinations of PLED materials and smaller organic molecules can also serve as active electronic layer. For example, a PLED may be chemically derivatized with a small organic molecule or simply mixed with a small organic molecule to form active electronic layer 316.

In addition to active electronic materials that emit light, active electronic layer 420 can include a material capable of charge transport. Charge transport materials include polymers or small molecules that can transport charge carriers. For example, organic materials such as polythiophene, derivatized polythiophene, oligomeric polythiophene, derivatized oligomeric polythiophene, pentacene, compositions including C60, and compositions including derivatized C60 may be used. Active electronic layer 420 may also include semiconductors, such as silicon or gallium arsenide.

In accordance with the invention, the emissive polymer or active electronic layer 420 is fabricated by 1) depositing (through ink-jet) an emitting polymer substance (solution) over the cross-linked HTL film; and 2) if desired, cross-linking the active electronic layer 420 to render it insoluble. Multi-color OLED displays can be created in this manner as shown in FIG. 3.

One example of such emissive polymers are emissive polymers of the poly-spiro family (such as spirobifluorene-co-fluorene polymers) which are soluble in toluene, ethanol and water. These emissive polymers (which can be synthesized/purchased in red, green and blue emitting forms) can be cross-linked with oxetane side-groups to render them insoluble. The emissive polymer solutions can also contain esters, di-aromatic bromides as well as a photo-acid to initiate cross-linking. The oxetane rings in this instance open up under application of UV radiation and cross-link with the emissive polymer. Such cross-linked films may also have to be washed or otherwise neutralized by the addition of bases or nucleophiles. Often cross-linking by UV radiation can create side reactions with the emissive polymers such that radical cations are formed which adversely affect the electro-luminescence of the film. Post-baking and other steps may be needed after cross-linking if this is observed to be the case.

Layer 421

In accordance with the invention, a layer 421 can be formed over the active electronic layer 420 as part of a double heterostructure. Layer 421 may also be cross-linked, if desired. In at least one embodiment of the invention, layer 421 has two functions. In a first function, layer 421 behaves as a electron transport layer (ETL) which improves the transport of electrons as they move to the active electronic layer 420. The ETL function of layer 421 aids in the transport of electrons much like HTL 417 aids in the transport of holes.

Using an efficient electron transport layer leads to a reduction in the operating voltage of the OLED display and hence improves the power efficiency of the device. The layer can be used to enhance the current carrying capacity of the device and hence can be useful for high luminance devices that require high current densities.

Layer 421 can also be configured with a hole blocking function. Hole blocking functionality can be introduced by ensuring that the highest occupied molecular orbital (HOMO) of the layer 421 is lower than the HOMO of, the active electronic layer 420. In so doing, holes which are injected from first electrode 411 will be trapped in the active electronic layer 420 and recombine therein. Double heterostructures are widely used in inorganic LED's and lasers as well as photodetectors. These structures are known to effectively enhance the efficiencies of the respective devices. The resulting higher efficiencies lower the power consumption for emissive devices such as LED's and lasers.

Layer 422

In accordance with the invention, another layer 422 can be formed above layer 421 by cross-linking layer 421 if necessary. Layer 422 can be configured as an ohmic layer for electron injection. The purpose of using an electron injection layer is to reduce the energy barriers to injection of current from the electrode into the emissive material of the OLED. This is especially important when high power applications are needed where electron and hole injection must be optimized.

Second Electrode (423)

In one embodiment, second electrode 423 functions as a cathode when an electric potential is applied across the first electrode 411 and second electrode 423. In this embodiment, when an electric potential is applied across the first electrode 411, which serves as the anode, and second electrode 423, which serves as the cathode, photons are released from active electronic layer 420 that pass through first electrode 411 and substrate 408.

While many materials, which can function as a cathode, are known to those of skill in the art, most preferably a composition that includes aluminum, indium, silver, gold, magnesium, calcium, and barium, or combinations thereof, or alloys thereof, is utilized. Aluminum, aluminum alloys, and combinations of magnesium and silver or their alloys are especially preferred.

Preferably, the thickness of second electrode 423 is from about 10 to about 1000 nanometers (nm), more preferably from about 50 to about 500 nm, and most preferably from about 100 to about 300 nm. While many methods are known to those of ordinary skill in the art by which the first electrode material may be deposited, vacuum deposition methods, such as physical vapor deposition (PVD) are preferred. Other layers (not shown) such as a barrier layer and getter layer may also be used to protect the electronic device. Such layers are well-known in the art and are not specifically discussed herein.

All of the organic or polymer layers and emissive polymer layers can be ink-jet printed by depositing a liquid solution in between the photo-resist banks which define a pocket. This liquid solution may be any "fluid" or deformable mass capable of flowing under pressure and may include solutions, inks, pastes, emulsions, dispersions and so on. The liquid may also contain or be supplemented by further substances which affect the viscosity, contact angle, thickening, affinity, drying, dilution and so on of the deposited drops.

Often other steps such as washing and neutralization of films, the addition of masks and photo-resists may precede the cathode deposition. However, these are not specifically enumerated as they do not relate specifically to the novel aspects of the invention. Other steps (not shown) like adding metal lines to connect the anode lines to power sources may also be included in the workflow. Also, for instance, after the OLED is fabricated it is often encapsulated to protect the layers from environmental damage or exposure. Such other processing steps are well-known in the art and are not a subject of the invention.

While the embodiments of the invention are illustrated in which it is primarily incorporated within an OLED display, almost any type of electronic device that uses dried film layers may be potential applications for these embodiments. In particular, present invention may also be utilized in a solar cell, a transistor, a phototransistor, a laser, a photo-detector, or an opto-coupler. It can also be used in biological applications such as bio-sensors or chemical applications such as applications in combinatorial synthesis etc. For instance, the HTL layer and/or emissive layer or separate layers can be designed to have a chemical, physical or photo-physical sensing function as needed. The OLED display described earlier can be used within displays in applications such as, for example, computer displays, information displays in vehicles, television monitors, telephones, printers, and illuminated signs.

What is claimed is:

1. An organic electronic device, comprising:
a deposition surface having at least one deposition region defined thereon;
a plurality of organic layers, wherein each said organic layer is in said deposition region on said deposition surface and a first portion of at least one of said organic layers is cross-linked so that the first portion is insoluble in an organic solution, and the first portion includes one of a silane, a di-aromatic bromide, a photo-acid, a multivalent cation, or an acidic group as a cross-linking material, wherein
the plurality of organic layers includes a hole transport layer, an emissive layer on the hole transport layer, an electron transport layer on the emissive layer and an electron injection layer on the electron transport layer; and
one of the emissive layer or the electron transport layers is cross-linked.

2. A device according to claim 1 wherein one of said plurality of organic layers is a first organic layer and one is a second organic layer, the first organic layer being closer to the deposition surface than the second organic layer and the first organic layer being the cross-linked organic layer.

3. A device according to claim 1 wherein at least one layer of said plurality of organic layers is capable of performing at least one of a hole blocking function, an electron blocking function, an optical confinement/wave-guiding function, an electron injection function, a hole injection function or an absorption function.

4. A device according to claim 1 wherein at least one of the organic layers is formed from an organic solution that includes cross-linking groups.

5. A device according to claim 1 wherein at least one of the organic layers is formed from an organic solution that includes an initiating agent.

6. A device according to claim 1 wherein said organic electronic device is an OLED device.

7. A device according to claim 6 wherein said deposition surface is a lower electrode layer.

8. A device according to claim 7 wherein said emissive layer is capable of emitting light upon charge recombination.

9. A device according to claim 8 further comprising a cathode layer disposed over said plurality of organic layers.

10. A device according to claim 1 wherein said hole transport layer is fabricated from a PEDOT:PSS solution including constituents capable of cross-linking.

11. A device according to claim 1 wherein said device behaves as an organic transistor.

12. A device according to claim 1 wherein said device behaves as an organic opto-electronic device.

13. A device according to claim 1 wherein said plurality of organic layers includes at least a first layer and a second layer and the first layer includes a different material from the second layer.

14. A device according to claim 1 wherein said hole transport layer is configured to perform an electron blocking function.

15. A device according to claim 1 wherein said hole transport layer is configured to perform a wave-guiding function.

16. A device according to claim 3 wherein a single organic layer of the plurality of organic layers performs said electron transport and hole blocking functions.

17. A device according to claim 3 wherein said electron transport function is performed in an organic layer of said plurality of organic layers.

18. A device according to claim 3 wherein said wave-guiding function is performed in an organic layer of said plurality of organic layers.

19. A device according to claim 3 wherein said electron injection function is performed in an organic layer of said plurality of organic layers.

20. The device of claim 1, wherein the deposition surface includes an electrode.

21. An organic electronic device, comprising:
a deposition surface; and
a plurality of organic layers, wherein a first portion of said organic layers is cross-linked to render said first portion of said organic layers insoluble;
wherein at least one cross-linking agent in the first portion adds functionality to the first portion that the first portion does not have without the cross-linking agent and the cross-linking agent adds the functionality in addition to cross-linking the first portion and the functionality added by the cross-linking agent is one of hole transport, electron transport, electron injection, hole blocking, optical confinement or waveguiding.

22. The device of claim 21, wherein at least one of the first or second organic layers is an emitting layer or contains a light-responsive material.

23. The device of claim 21, wherein said plurality of organic layers includes at least a first organic layer and a second organic layer, the first organic layer being closer to the deposition surface than the second organic layer and the first organic layer being a cross-linked organic layer.

24. The device of claim 23, wherein said plurality of organic layers includes a hole transport layer.

25. The device of claim 24, wherein said hole transport layer is fabricated from a PEDOT:PSS solution including constituents capable of cross-linking.

26. The device of claim 24, wherein said hole transport layer is configured to perform an electron blocking function.

27. The device of claim 24, wherein said hole transport layer is configured to perform a wave-guiding function.

28. The device of claim 24, wherein at least one layer of said plurality of organic layers is capable of performing at least one of a hole blocking function, an electron blocking function, an electron transport function, a hole transport function, an optical confinement/wave-guiding function, an electron injection function, a hole injection function, an emission function, an absorption function, or a chemical, physical or photophysical sensor function.

29. The device of claim 28, wherein said wave-guiding function is performed in an organic layer of said plurality of organic layers.

30. The device of claim 28, wherein said electron injection function is performed in an organic layer of said plurality of organic layers.

31. The device of claim 28, wherein a single organic layer of the plurality of organic layers performs said electron transport and hole blocking functions.

32. The device of claim 28, wherein said electron transport function is performed in an organic layer of said plurality of organic layers.

33. The device of claim 21, wherein at least one of the organic layers is formed from an organic solution that includes cross-linking groups.

34. The device of claim 21, wherein at least one of the organic layers is formed from an organic solution that includes an initiating agent.

35. The device of claim 21, wherein said organic electronic device is an OLED device.

36. The device of claim 35, wherein said deposition surface is a lower electrode layer.

37. The device of claim 36, wherein at least one of said plurality of organic layers is an emissive layer, said emissive layer capable of emitting light upon charge recombination.

38. The device of claim 37, further comprising a cathode layer disposed over said plurality of organic layers.

39. The device of claim 21, wherein said device behaves as an organic transistor.

40. The device of claim 21, wherein said device behaves as an organic opto-electronic device.

41. The device of claim 21, wherein said plurality of organic layers includes at least a first layer and a second layer and the first layer includes a different material from the second layer.

42. The device of claim 21, wherein the deposition surface includes an electrode.

43. The device of claim 21, wherein:

the plurality of organic layers includes a hole transport layer, an emissive layer on the hole transport layer, an electron transport layer on the emissive layer and an electron injection layer on the electron transport layer; and one of the emissive layer or the electron transport layers is cross-linked.

* * * * *